(12) United States Patent
Pal et al.

(10) Patent No.: US 7,682,845 B2
(45) Date of Patent: Mar. 23, 2010

(54) METHODS FOR CALIBRATING A PROCESS FOR GROWING AN EPITAXIAL SILICON FILM AND METHODS FOR GROWING AN EPITAXIAL SILICON FILM

(75) Inventors: Rohit Pal, Fishkill, NY (US); Alok Vaid, Beacon, NY (US); Kevin Lensing, Austin, TX (US)

(73) Assignee: GlobalFoundries Inc., Grand Caymen (KY)

( * ) Notice: Subject to any disclaimer, the term of this patent is extended or adjusted under 35 U.S.C. 154(b) by 276 days.

(21) Appl. No.: 11/964,935

(22) Filed: Dec. 27, 2007

(65) Prior Publication Data

US 2009/0170223 A1 Jul. 2, 2009

(51) Int. Cl.
*G01R 31/26* (2006.01)

(52) U.S. Cl. .................................. 438/16; 257/E21.09

(58) Field of Classification Search ................... 438/16, 438/27, 65; 427/162; 257/13, 22, 103, E21.521–E21.531, 257/E21.09

See application file for complete search history.

(56) References Cited

U.S. PATENT DOCUMENTS 6,625,514 B1 * 9/2003 Lensing ...................... 700/121

2007/0072398 A1 * 3/2007 Shibata et al. .............. 438/478
2009/0075029 A1 * 3/2009 Thomas et al. ............. 428/173

* cited by examiner

*Primary Examiner*—Ha Tran T Nguyen
*Assistant Examiner*—Shaun Campbell
(74) *Attorney, Agent, or Firm*—Ingrassia Fisher & Lorenz, P.C.

(57) ABSTRACT

Methods are provided for calibrating a process for growing an epitaxial silicon-comprising film and for growing an epitaxial silicon-comprising film. One method comprises epitaxially growing a first silicon-comprising film on a first silicon substrate that has an adjacent non-crystalline-silicon structure that extends from said first silicon substrate. The step of epitaxially growing uses hydrochloric acid provided at a first hydrochloric acid flow rate for a first time period. A morphology of the first film relevant to the adjacent non-crystalline-silicon structure is analyzed and a thickness of the first film is measured. The first flow rate is adjusted to a second flow rate based on the morphology of the first film. The first time period is adjusted to a second time period based on the second flow rate and the thickness. A second silicon-comprising film on a second silicon substrate is epitaxially grown for the second time period using the second flow rate.

16 Claims, 3 Drawing Sheets

METHODS FOR CALIBRATING A PROCESS FOR GROWING AN EPITAXIAL SILICON FILM AND METHODS FOR GROWING AN EPITAXIAL SILICON FILM

FIELD OF THE INVENTION

The present invention relates to methods for fabricating semiconductor devices, and more particularly relates to methods for calibrating a process for growing epitaxial silicon films in MOS devices and methods for growing an epitaxial silicon film.

BACKGROUND OF THE INVENTION

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode disposed overlying a semiconductor substrate and spaced apart source and drain regions disposed within the substrate and between which a current can flow. A control voltage applied to the gate electrode controls the flow of current through a channel within the substrate between the source and drain regions.

Epitaxially-grown silicon films often are used in MOS transistors to modify the performance of such transistors. For example, an epitaxially-grown silicon film can be used to increase the mobility of majority carriers through the channel of an MOS transistor by inducing stresses in the channel. The mobility of holes, the majority carrier in a P-channel MOS (PMOS) transistor can be increased by applying a compressive longitudinal stress to the channel, especially when the transistor is fabricated on a silicon wafer. It is well known that a compressive longitudinal stress can be applied to a silicon MOS transistor by embedding an epitaxially-grown material such as silicon germanium (SiGe) at the ends of the transistor channel. Similarly, the mobility of electrons, the majority carrier in an N-channel MOS (NMOS) transistor can be increased by applying a tensile longitudinal stress to the channel. Such a stress can be applied to a silicon MOS transistor by embedding a material such as epitaxially-grown silicon doped with carbon at the ends of the transistor channel. Such methods typically require the etching of trenches into the silicon substrate and the selective epitaxial deposition of silicon germanium and/or silicon carbon.

Ideally, the epitaxial growth of silicon films is conducted for a time sufficient to ensure that the film has grown to a predetermined thickness within all relevant trenches or on all relevant surfaces of all devices on a semiconductor wafer. Any undergrowth of the epitaxial silicon film can result in device-to-device variations and wafer-to-wafer variations that can reduce device yield. To ensure adequate growth of an epitaxial film across a semiconductor wafer, or from wafer to wafer, the epitaxial silicon film generally is grown for a period slightly longer than that typically required for the film to grow to a predetermined thickness. In other words, the film is slightly overgrown.

While overgrowth may be advantageous for certain purposes, it can be disadvantageous for others. If the overgrown epitaxial silicon film grows uniformly, that is, its leading edge has a relatively flat profile, and the overgrown epitaxial silicon film grows beyond surfaces of an adjacent structure, the epitaxial silicon film is said to have "popped" with respect to the adjacent structure. FIG. 1 illustrates an example of an overgrown epitaxial silicon film 20 that has popped relative to a silicon substrate 12. In this example, an MOS gate structure 10 is disposed on the silicon substrate 12 with dielectric spacers 14 that are formed about sidewalls 11 of the gate structure 10 and that extend beyond an upper surface 15 of the silicon substrate. MOS gate structure 10 comprises a gate insulator 24 on the silicon substrate 12 and a gate electrode 16 disposed on the gate insulator. Trenches 18 are etched into the silicon substrate and are filled with an epitaxially-grown silicon-comprising film 20. As evident in FIG. 1, the epitaxially-grown silicon-comprising film is uniformly overgrown such that the leading edge 17 of the epitaxial silicon-comprising film is relatively flat and the epitaxial silicon-comprising film 20 has grown along, not only side surfaces 19 of the trenches 18, but also along the side surfaces of gate insulator 24 and spacers 14. FIG. 2 illustrates another example of an overgrown epitaxial silicon-comprising film 62 that has popped relative to a shallow trench isolation (STI) structure 60 disposed on silicon substrate 12 and that extends from a surface 63 thereof. As evident in FIG. 2, the epitaxially-grown silicon-comprising film 62 is uniformly overgrown such that a leading edge 61 of the epitaxial silicon-comprising film 62 is relatively flat and the epitaxial silicon-comprising film 62 has grown along a side surface 64 of STI structure 60 and beyond the side surface. One problem with popping results because, typically following the growth of an epitaxial silicon-comprising film, the epitaxial silicon-comprising film is implanted with conductivity-type impurity ions to form source and drain regions of the MOS device. When implanting into the epitaxial layer, the energy of the implant must be adjusted to compensate for the thickness of the layer. For the "popped" case, the overgrown thickness follows the across-wafer, wafer-to-wafer, and lot-to-lot variations inherent in the epitaxy process. This can lead to significant device variability and even yield degradation.

In contrast, it is preferable that the epitaxially-grown silicon-comprising films are "pinned" to an adjacent structure. "Pinning" occurs when growth of the epitaxial silicon-comprising film along the surface of an adjacent structure terminates at the end of the surface, although growth towards the center of the epitaxial silicon-comprising film may continue. In this regard, excess epitaxial silicon growth is minimized particularly at the surface of the adjacent structure, which is most critical for controlling device characteristics, although overgrowth at the center of the film insures the overall growth of the epitaxial silicon-comprising film to a predetermined average thickness. Thus, the amount of additional epitaxial silicon-comprising film that the impurity ions must penetrate to form the source and drain regions or other doped regions is minimized. FIG. 3 illustrates an example of the overgrown epitaxial silicon-comprising film 20 of FIG. 1 that is pinned relative to the silicon substrate 12. As is evident in FIG. 3, growth of the epitaxial silicon-comprising film 20 along the side surfaces 19 of the trenches 18 terminated at an end of the side surfaces 19 while growth of the film 20 towards its center continued. Similarly, FIG. 4 illustrates the overgrown epitaxial silicon-comprising film 62 of FIG. 2 that is pinned relative to the STI structure 60. As evident in FIG. 4, growth of the epitaxial silicon-comprising film terminated at the end of the side surface 64 of STI structure 60 while growth of the film 62 towards its center continued. Thus, it is desirable to grow epitaxial silicon-comprising films that provide for overgrowth but also provide for pinning at surfaces of adjacent structures.

While it is desirable to have overgrowth and pinning that are uniform from device to device on a wafer and from wafer to wafer, such uniformity may be compromised when variations in the growth process arise due to, for example, equipment malfunction, change in environmental conditions, and the like. A change in the uniformity of overgrowth and pinning can result in implant shadowing and varied implant profiles, which in turn can result in significant differences in device characteristics from device to device, wafer to wafer, and lot to lot.

Accordingly, it is desirable to provide methods for calibrating a process for growing epitaxial silicon-comprising films that result in both overgrowth of the films and pinning of the films to adjacent structures wherein the overgrowth and pinning is uniform across a wafer. In addition, it is desirable to provide methods for growing epitaxial silicon-comprising films that result in overgrowth and pinning to adjacent structures wherein the overgrowth and pinning is uniform across a wafer. Further, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with an exemplary embodiment of the invention, a method for calibrating a process for growing an epitaxial silicon-comprising film comprises epitaxially growing a first silicon-comprising film on a first silicon substrate that has an adjacent non-crystalline-silicon structure that extends from the first silicon substrate. The step of epitaxially growing uses hydrochloric acid provided at a first hydrochloric acid flow rate for a first time period. A morphology of the first silicon-comprising film relevant to the adjacent non-crystalline-silicon structure is analyzed and a thickness of the first silicon-comprising film is measured. The first flow rate is adjusted to a second flow rate based on the morphology of the first silicon-comprising film. The first time period is adjusted to a second time period based on the second flow rate and the thickness. A second silicon-comprising film on a second silicon substrate is epitaxially grown for the second time period using the second flow rate.

In accordance with an exemplary embodiment of the invention, a method for growing an epitaxial silicon-comprising film is provided. The method comprises providing a first silicon substrate that has a first non-crystalline-silicon structure that extends beyond a surface of the first silicon substrate and etching a first trench in the first silicon substrate proximate to the first non-crystalline-silicon structure. A first epitaxial silicon-comprising film is grown within the first trench while providing a flow rate of hydrochloric acid to the first silicon substrate, the step of growing performed for a period of time. It is then determined if the first epitaxial silicon-comprising film has grown beyond the first trench and along the first non-crystalline-silicon structure. The step of determining is performed after the step of growing. A thickness of the first epitaxial silicon-comprising film is measured, the step of measuring performed after the step of growing. The flow rate of hydrochloric acid is adjusted to an adjusted flow rate if it is determined that the first epitaxial silicon-comprising film has grown beyond the first trench and along the first non-crystalline-silicon structure. The time period is adjusted to an adjusted time period based on the adjusted flow rate and the thickness of the first epitaxial silicon-comprising film. A second silicon substrate that has a second non-crystalline-silicon structure that extends beyond a surface of the second silicon substrate is provided and a second trench is etched in the second silicon substrate proximate to the second non-crystalline-silicon structure. A second epitaxial silicon-comprising film is grown within the second trench while providing the adjusted flow rate of hydrochloric acid to the second silicon substrate, the step of growing performed for the adjusted period of time.

In accordance with an exemplary embodiment of the invention, a method for fabricating a semiconductor device on and within a silicon substrate is provided. The method comprises providing a first silicon substrate that has a first gate stack disposed thereon and a first non-crystalline-silicon spacer disposed about sidewalls of the first gate stack. A first trench is etched in the first silicon substrate using the first gate stack and the first non-crystalline silicon spacer as an etch mask. A first epitaxial silicon-comprising film is grown within the first trench while providing a first flow rate of hydrochloric acid to the first silicon substrate. The step of growing is performed for a first period of time. It is determined if the first epitaxial silicon-comprising film has popped in relation to the first non-crystalline-silicon spacer, the step of determining performed after the step of growing. A thickness of the first epitaxial silicon-comprising film is measured after the step of growing. The first flow rate of hydrochloric acid is adjusted to a second flow rate if it is determined that the first epitaxial silicon-comprising film has popped. The time period is adjusted to a second time period based on the second flow rate and the thickness of the first epitaxial silicon-comprising film. A second silicon substrate that has a second gate stack that is disposed thereon and a second non-crystalline-silicon spacer disposed about sidewalls of the second gate stack is provided and a second trench is etched in the second silicon substrate using the second gate stack and the second non-crystalline-silicon spacer as an etch mask. A second epitaxial silicon-comprising film is grown within the second trench while providing the second flow rate of hydrochloric acid to the second silicon substrate, the step of growing performed for the second time period.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 5:
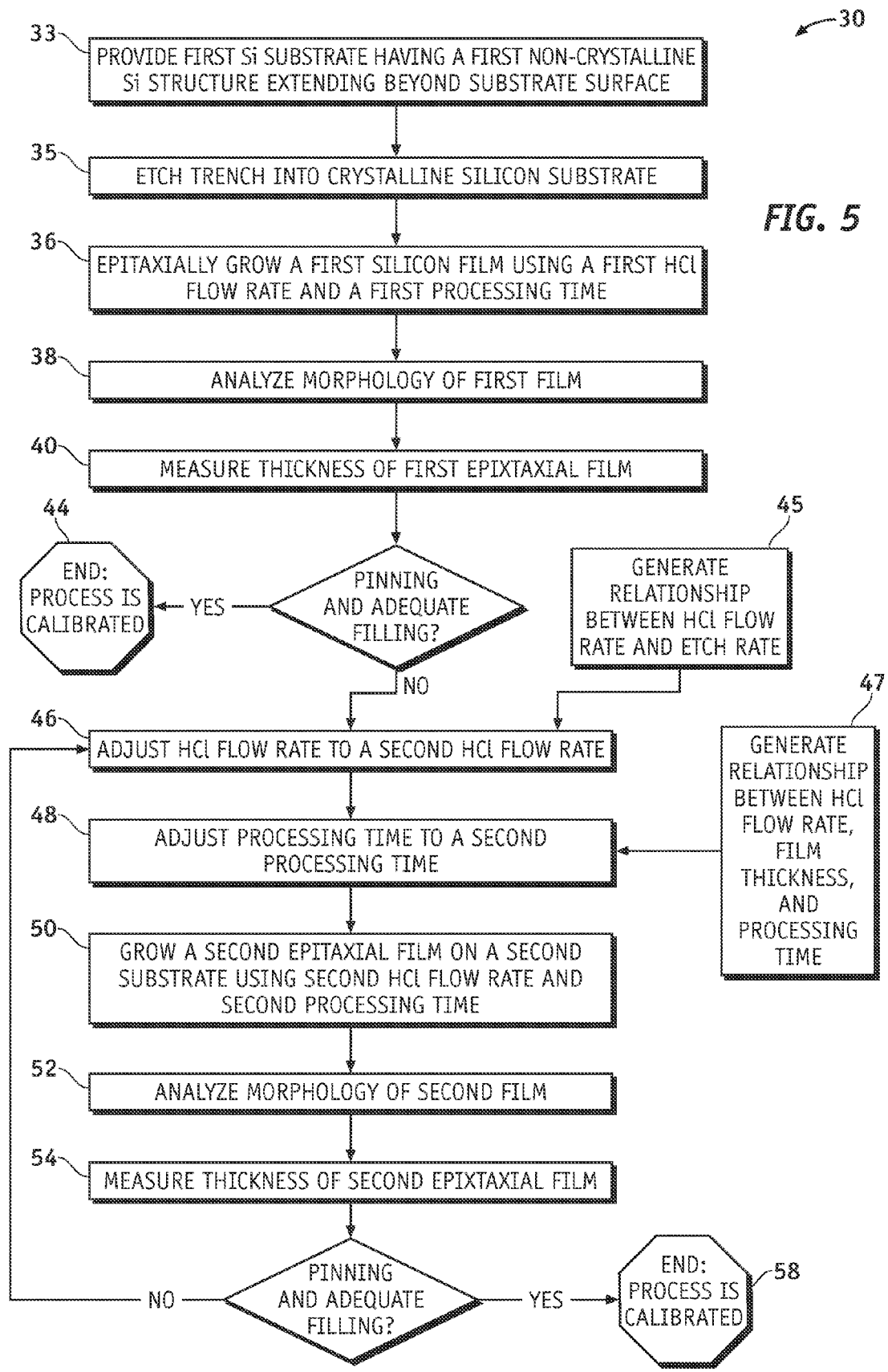
FIG. 5 is a flow diagram of a method for growing an epitaxial silicon-comprising film for an MOS device in accordance with an exemplary embodiment of the present invention.

FIG. 5 is a flow diagram of a method 30 for growing an epitaxial silicon-comprising film for an MOS device. Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
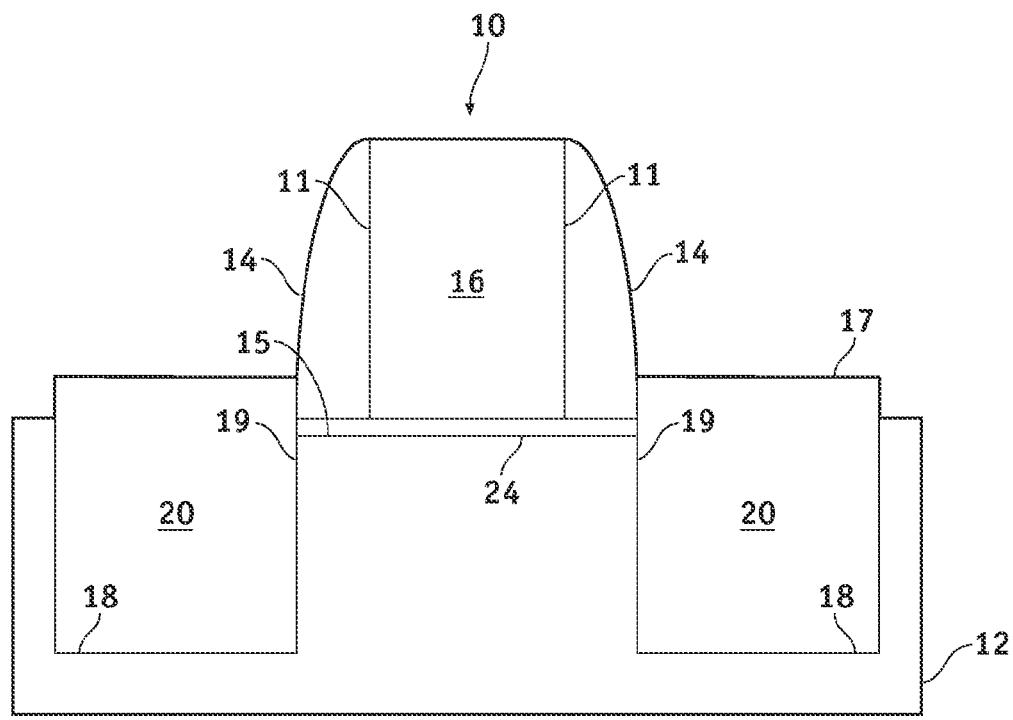
FIG. 1 illustrates an epitaxially-grown silicon-comprising film that has popped relative to side surfaces of trenches formed adjacent to a conventional gate structure of a MOS device.
Figure 3:
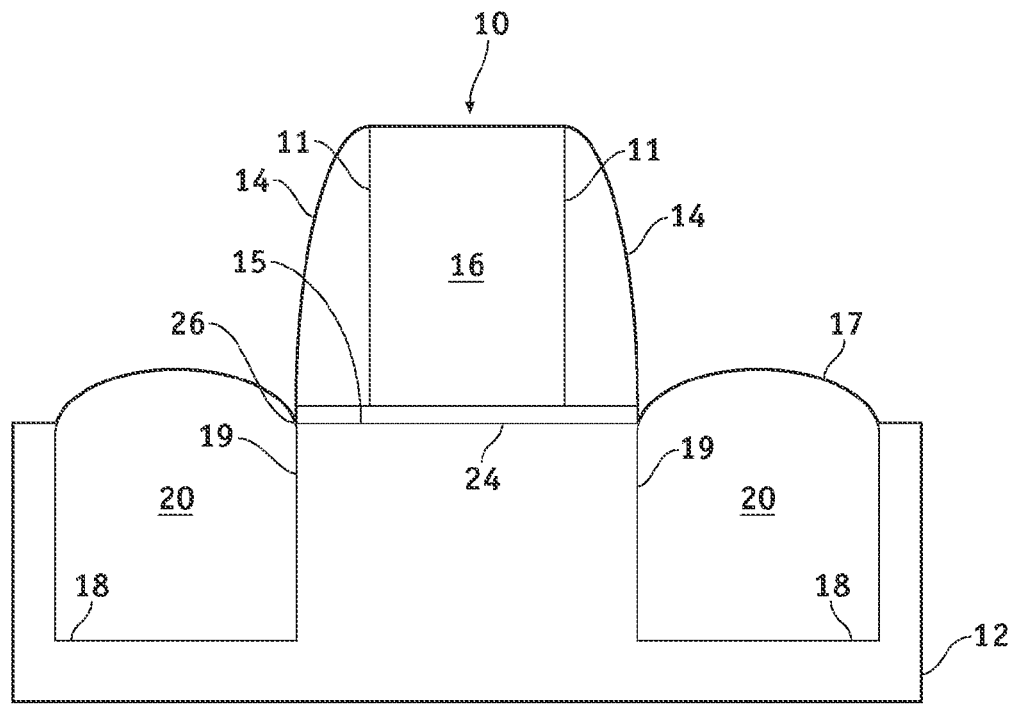
FIG. 3 illustrates the epitaxially-grown silicon-comprising film of FIG. 1 pinned to a side surface of the trenches.
Figure 2:
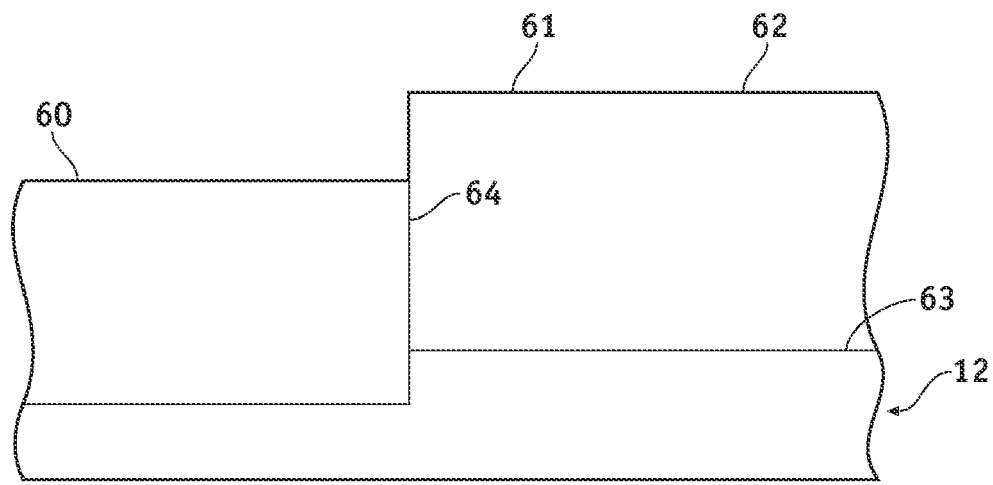
FIG. 2 illustrates an epitaxially-grown silicon-comprising film that has popped relative to an STI structure.
Figure 4:
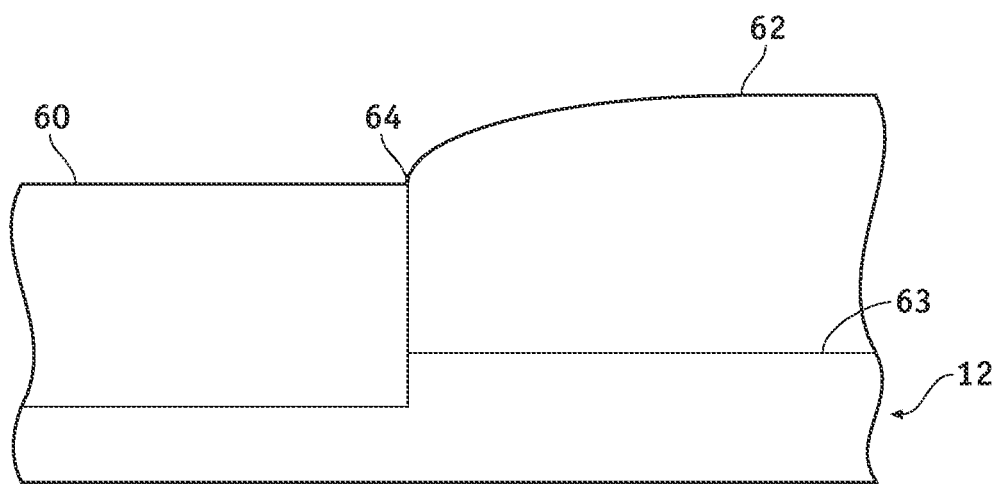
FIG. 4 illustrates the epitaxially-grown silicon-comprising film of FIG. 2 that has pinned relative to the STI structure.

Referring to FIG. 5, method 30 begins with the step of providing a first crystalline silicon substrate, such as silicon substrate 12 of FIGS. 1-4, having a non-crystalline-silicon structure (step 33). The term "crystalline silicon substrate" is used herein to encompass the generally monocrystalline and relatively pure silicon materials typically used in the semiconductor industry. Silicon substrate 12 may be a bulk silicon wafer or a thin layer of silicon on an insulating layer (commonly know as silicon-on-insulator or SOI) that, in turn, is supported by a silicon carrier wafer, but is here illustrated, without limitation, as a bulk silicon wafer. The term "non-crystalline-silicon structure" is used herein to mean any structure that is formed of non-crystalline silicon, such as amorphous silicon-comprising materials (i.e., silicon dioxide or silicon nitride) or materials, whether crystalline or non-crystalline, that do not comprise any silicon. For example, as illustrated in FIGS. 1 and 3, the non-crystalline-silicon structure can be a gate insulator 24 and/or a dielectric spacer 14 that overlies the silicon substrate 12 and extends beyond the surface 15 of the substrate. In another example, such as in FIGS. 2 and 4, the non-crystalline-silicon structure can be an STI structure 60 that extends beyond the surface 63 of the substrate 12 when a trench is etched within substrate 12.

In an optional embodiment of the present invention, method 30 continues by etching trenches into the crystalline-silicon substrate 12 adjacent to the non-crystalline-silicon structure (step 35). The trenches can be etched, for example, by reactive ion etching (RIE) using an $HBr/O_2$ chemistry. In one exemplary embodiment, the trenches can be etched using the non-crystalline-silicon structure as an etch mask, such as by using MOS gate structure 10 of FIGS. 1 and 3 as an etch mask.

Following the formation of any trenches, a first silicon-comprising film is epitaxially grown on substrate 12 for a first time period using hydrochloric acid (HCl) at a first flow rate (step 36). The first epitaxial silicon-comprising film can be grown by the reduction of silane ($SiH_4$) or dichlorosilane ($SiH_2Cl_2$) in the presence of the hydrochloric acid and, optionally, in the presence of impurity dopants such as, for example, carbon or germanium. As is well known, growth of an epitaxial silicon-comprising film along a surface formed of a material other than crystalline silicon can be controlled by use of HCl during the growth process. The use of HCl in the epitaxial growth process imparts a selectivity to the process because HCl etches epitaxial silicon deposited on non-crystalline-silicon surfaces at a rate different from the rate at which it etches epitaxial silicon deposited on a crystalline silicon surface. Accordingly, once the first epitaxial silicon-comprising film is grown on the first crystalline silicon substrate, the morphology of the film, that is, its shape and structure is analyzed. In particular, the first epitaxial silicon-comprising film is analyzed to determine if it is pinned to a desired adjacent structure (e.g., either the side surfaces of the silicon substrate trench or the side surfaces of an STI structure) or if it has popped relative to the structure (step 38). Techniques that are useful for this type of morphological analysis include scatterometry, scanning electron microscopy, and atomic force microscopy, as well as other techniques known to those skilled in the art of surface analysis. In addition to analyzing the film morphology, the average thickness of the film is measured to determine if it is substantially equal to a predetermined average thickness (step 40). The average thickness of the film is determined by measuring the thickness of the film at various locations of the film and averaging the measurements made. Film thickness is generally sampled using an optical technique such as spectroscopic ellipsometry. Alternatively, film thickness can also be measured by examining a sample in cross section using a scanning electron microscope calibrated to measure critical dimensions. The latter technique is especially useful for measuring the thickness of films that are adjacent to structures extending from the substrate. While FIG. 5 illustrates the step of analyzing the morphology of the first epitaxial silicon film (step 38) before the step of measuring the thickness of the film (step 40), it will be appreciated that the steps can be performed substantially simultaneously or in reverse order.

If it is determined that the first epitaxially-grown silicon-comprising film is pinned to the desired adjacent structure and that it is substantially equal to a predetermined average thickness, the epitaxial silicon deposition process is considered to be within specifications and the calibration is complete (step 44). If, however, popping has occurred, the HCl flow rate is adjusted to a second HCl flow rate that is greater than the first HCl flow rate (step 46). In one exemplary embodiment of the invention, a relationship between HCl flow rate and etch rate of the epitaxial silicon-comprising film relative to the material of the adjacent non-crystalline-silicon structure can be determined by performing various experiments that measure the etch rate for predetermined HCl flow rates. From the results of such experiments, a relationship in the form of a mathematical formula or a look-up table can be generated (step 45). Accordingly, the appropriate adjustment in HCl flow rate for step 46 can be estimated using the previously-generated mathematical formula and/or look-up table. The first processing time then is adjusted to a second processing time based, at least in part, on the second HCl flow rate and the first epitaxial silicon-comprising film thickness (step 48). In another exemplary embodiment of the invention, a relationship between HCl flow rate, epitaxial silicon-comprising film thickness, and processing or etching time can be determined by performing various experiments that measure the processing time for predetermined HCl flow rates and film thicknesses. From the results of such experiments, a relationship in the form of a mathematical formula or a look-up table can be determined (step 47). Accordingly, the appropriate adjustment in processing time for step 48 can be estimated using such previously-generated look-up tables and/or mathematical formulations. For example, an increase in the HCl flow rate generally will decrease the growth rate of an epitaxial silicon film. As a result, if HCl flow is increased for an epitaxial silicon growth process, the total processing time must be increased accordingly to achieve the same overall film thickness.

After adjustments are made to the HCl flow rate and the overall processing time, a second epitaxial silicon-comprising film is grown on a second silicon substrate having a second non-crystalline-silicon structure using the adjusted operating conditions (step 50). The second epitaxial silicon-comprising film is evaluated in the same manner as the first film by analyzing film morphology (step 52), and by measuring film thickness (step 54). As discussed above, these results are analyzed and used to determine whether the film has popped or pinned in relation to an adjacent structure, and to determine whether the film thickness is substantially equal to a predetermined average thickness. If these results show that the film meets all specifications in regards to both pinning and thickness, the calibration is complete (step 58) and the adjusted processing parameters for HCl flow rate and processing time are used for subsequent epitaxial silicon film growth processing. If popping recurs, the sequence of steps is repeated beginning with step 46 by making a further adjustment in HCl flow rate (step 46) and processing time (step 48). The steps 46-54 of method 30 are repeated until HCl flow rate and processing time parameters produce an epitaxial silicon film that is substantially equal to a predetermined average thickness and is pinned to the adjacent structure. At this point, the calibration is complete and the processing parameters are used for subsequent epitaxial silicon film growth.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof

What is claimed is:

1. A method for calibrating a process for growing an epitaxial silicon-comprising film, the method comprising the steps of:
    epitaxially growing a first silicon-comprising film on a first silicon substrate that has an adjacent non-crystalline-silicon structure that extends from said first silicon substrate, wherein the step of epitaxially growing uses hydrochloric acid provided at a first hydrochloric acid flow rate for a first time period;
    determining if said first silicon-comprising film is pinned relative to an adjacent structure;
    measuring a thickness of said first silicon-comprising film;
    adjusting said first hydrochloric acid flow rate to a second hydrochloric acid flow rate based on whether said first silicon-comprising film is pinned relative to said adjacent structure;
    adjusting said first time period to a second time period based on said second hydrochloric acid flow rate and said thickness; and
    epitaxially growing for said second time period a second silicon-comprising film on a second silicon substrate using said second hydrochloric acid flow rate.

2. The method of claim 1, wherein said adjacent non-crystalline-silicon structure is a spacer, said adjacent structure is the silicon substrate, and the step of determining comprises the step of determining if said first silicon-comprising film is pinned relative to the silicon substrate.

3. The method of claim 2, wherein the step of measuring a thickness comprises the step of measuring an average thickness of said first silicon-comprising film and determining if said average thickness is equal to a predetermined average thickness.

4. The method of claim 1, wherein said adjacent structure is said adjacent non-crystalline-silicon structure, which is a shallow trench isolation (SIT) structure, and wherein the step of determining comprises the step of determining if said first silicon-comprising film is pinned in relation to said STI structure.

5. The method of claim 4, wherein the step of measuring a thickness comprises the step of measuring an average thickness of said first silicon-comprising film adjacent to said STI structure and determining if said average thickness is equal to a predetermined average thickness.

6. The method of claim 1, wherein the step of measuring a thickness comprises the step of determining whether an average thickness of said first silicon-comprising film is substantially equal to a predetermined average thickness.

7. The method of claim 1, wherein the step of determining is performed using scatterometry.

8. The method of claim 1, wherein the step of adjusting said first time period to a second time period based on said second hydrochloric acid flow rate and said thickness comprises the step of adjusting said first time period to a second time period based on a previously-generated relationship between HCl flow rate, epitaxial silicon-comprising film thickness, and processing time.

9. A method for growing an epitaxial silicon-comprising film, the method comprising the steps of:
    providing a first silicon substrate that has a first non-crystalline-silicon structure that extends beyond a surface of said first silicon substrate;
    etching a first trench in said first silicon substrate proximate to said first non-crystalline-silicon structure;
    growing a first epitaxial silicon-comprising film within said first trench while providing a flow rate of hydrochloric acid to said first silicon substrate, the step of growing performed for a time period;
    determining if said first epitaxial silicon-comprising film has grown beyond said first trench and along said first non-crystalline-silicon structure, the step of determining performed after the step of growing;
    measuring a thickness of said first epitaxial silicon-comprising film, the step of measuring performed after the step of growing;
    adjusting said flow rate of hydrochloric acid to an adjusted flow rate if it is determined that said first epitaxial silicon-comprising film has grown beyond said first trench and along said first non-crystalline-silicon structure;
    adjusting said time period to an adjusted time period based on said adjusted flow rate and said thickness of said first epitaxial silicon-comprising film;
    providing a second silicon substrate that has a second non-crystalline-silicon structure that extends beyond a surface of said second silicon substrate;
    etching a second trench in said second silicon substrate proximate to said second non-crystalline-silicon structure; and
    growing a second epitaxial silicon-comprising film within said second trench while providing said adjusted flow rate of hydrochloric acid to said second silicon substrate, the step of growing performed for said adjusted time period.

10. The method of claim 9, wherein the step of measuring a thickness comprises the step of determining whether an average thickness of said first epitaxial silicon-comprising film is substantially equal to a predetermined average thickness.

11. The method of claim 9, wherein the step of determining if said first epitaxial silicon-comprising film has grown beyond said first trench and along said first non-crystalline-silicon structure is performed using scatterometry.

12. The method of claim 9, wherein the step of providing a first silicon substrate that has a first non-crystalline-silicon structure that extends beyond a surface of said first silicon substrate comprises the step of providing a first silicon substrate that has a dielectric spacer that extends beyond a surface of said first silicon substrate.

13. The method of claim 9, wherein the step of providing a second silicon substrate that has a second non-crystalline-silicon structure that extends beyond a surface of said second silicon substrate comprises providing a second silicon substrate that has a dielectric spacer that extends beyond a surface of said second silicon substrate.

14. A method of fabricating a semiconductor device on and within a silicon substrate, the method comprising the steps of:

provingig a first silicon substrate that has a first gate stack disposed thereon and a first non-crystalline-silicon spacer disposed about sidewalls of said first gate stack;

etching a first trench in said first silicon substrate using said first gate stack and said first non-crystalline-silicon spacer as an etch mask;

growing a first epitaxial silicon-comprising film within said first trench while providing a first flow rate of hydrochloric acid to said first silicon substrate, the step of growing performed for a first time period;

determining if said first epitaxial silicon-comprising film has popped in relation to said first non-crystalline-silicon spacer, the step of determining performed after the step of growing;

measuring a thickness of said first epitaxial silicon-comprising film, the step of measuring performed after the step of growing;

adjusting said first flow rate of hydrochloric acid to a second flow rate if it is determined that said first epitaxial silicon-comprising film has popped;

adjusting said first time period to a second time period based on said second flow rate and said thickness of said first epitaxial silicon-comprising film;

providing a second silicon substrate that has a second gate stack that is disposed thereon and a second non-crystalline-silicon spacer disposed about sidewalls of said second gate stack;

etching a second trench in said second silicon substrate using said second gate stack and said second non-crystalline-silicon spacer as an etch mask; and growing a second epitaxial silicon film within said second trench while providing said second flow rate of hydrochloric acid to said second silicon substrate, the step of growing performed for said second time period.

15. The method of claim 14, wherein the step of measuring a thickness comprises the step of determining whether an average thickness of said first epitaxial silicon-comprising film is substantially equal to a predetermined average thickness.

16. The method of claim 14, wherein the step of determining if said first epitaxial silicon-comprising film has popped is performed using scatterometry.

* * * * *